(12) United States Patent
Muench et al.

(10) Patent No.: US 9,696,373 B2
(45) Date of Patent: Jul. 4, 2017

(54) VERIFICATION AND CERTIFICATION OF AN ELECTRONIC COMPONENT

(71) Applicant: Airbus Defence and Space GmbH, Ottobrunn (DE)

(72) Inventors: Daniel J. Muench, München (DE); Michael Paulitsch, Ottobrunn (DE); Michael Honold, Geislingen/Stg. (DE); Wolfgang Schlecker, Emerkingen (DE)

(73) Assignee: Airbus Defence and Space GmbH (DE)

( * ) Notice: Subject to any disclaimer, the term of this patent is extended or adjusted under 35 U.S.C. 154(b) by 0 days.

(21) Appl. No.: 14/659,843

(22) Filed: Mar. 17, 2015

(65) Prior Publication Data
US 2015/0268296 A1    Sep. 24, 2015

(30) Foreign Application Priority Data

Mar. 18, 2014  (DE) .......................... 10 2014 103 703

(51) Int. Cl.
*G06F 9/45* (2006.01)
*H03K 19/177* (2006.01)
(Continued)

(52) U.S. Cl.
CPC ............. *G01R 31/28* (2013.01); *G06Q 10/00* (2013.01); *H03K 19/17764* (2013.01); *G01R 31/00* (2013.01)

(58) Field of Classification Search
CPC ............ G01R 31/2891; G01R 31/2808; G01R 31/2887; H03K 19/17728;
(Continued)

(56) References Cited

U.S. PATENT DOCUMENTS

| 4,340,858 A | * | 7/1982 | Malloy | .............. G01R 1/07364 |
| | | | | 324/72.5 |
| 4,538,104 A | * | 8/1985 | Douglas | ............. G01R 1/07328 |
| | | | | 324/750.2 |

(Continued)

FOREIGN PATENT DOCUMENTS

WO          02/10785 A2     2/2002

OTHER PUBLICATIONS

Extended European Search Report Jul. 27, 2015 (EP 15158972.8).
(Continued)

*Primary Examiner* — Jermele M Hollington
*Assistant Examiner* — Taqi Nasir
(74) *Attorney, Agent, or Firm* — Lerner, David, Littenberg, Krumholz & Mentlik, LLP

(57) ABSTRACT

A circuit is designed to be executed in a predeterminable operating mode of a plurality of operating modes. The circuit includes a first functional unit and a second functional unit. The first functional unit is designed as a static functional unit that in each of the plurality of operating modes of the circuit carries out a consistent function. The second functional unit is designed as an adaptable functional unit that is designed to be configured, prior to the circuit being put into service, according to a first configuration of a plurality of different configurations and during the operating time of the circuit to maintain the first configuration so that the first configuration of the second functional unit defines the predeterminable operating mode of the circuit. This makes it possible to reduce the verification expenditure for the circuit because verification can be limited to the adaptable functional unit.

11 Claims, 2 Drawing Sheets

(51) Int. Cl.
 *G01R 31/28* (2006.01)
 *G06Q 10/00* (2012.01)
 *G01R 31/00* (2006.01)

(58) Field of Classification Search
 CPC ....... H03K 19/17736; H03K 19/17748; H03K 19/77; G06F 9/45; G06F 17/5072; G06F 17/5045; G06F 17/505
 USPC ............. 324/750.25, 211, 76.61, 712, 76.28, 324/76.47, 76.55, 76.82; 326/38, 39, 8, 326/41, 47; 716/4, 5, 6, 7, 18, 14, 12; 714/48–49, 724, 733–734
 See application file for complete search history.

(56) References Cited

U.S. PATENT DOCUMENTS

| | | | | |
|---|---|---|---|---|
| 4,864,219 A | * | 9/1989 | Parsons | G01R 31/2836 324/73.1 |
| 5,175,230 A | * | 12/1992 | Quay | C08G 18/758 528/59 |
| 5,276,395 A | * | 1/1994 | Malloy | G01R 31/2801 324/72.5 |
| 5,457,408 A | * | 10/1995 | Leung | G06F 17/5054 326/38 |
| 6,615,392 B1 | * | 9/2003 | Nadeau-Dostie | G01R 31/318586 716/103 |

OTHER PUBLICATIONS

German Office Action dated Oct. 30, 2014 (DE 10 2014 103 703.0).
Kettelheit, B.: Architektur and Entwurf dynamisch rekonfigurierbarer FPGA-Systeme. Dissertation, 2009. Im Internet: <URL: http:/ldigital.ub.uni•paderborn.de/hs/content/titleinfo/5504> (English Abstract Only).
Egger, C.: Konfigurationstechniken. Proseminar FPGAs. 2003. Im Internet: <URL:<http://www.informatik.uni-ulm.de/ni/Lehre/SS03/ProSemFPGA/Konfigurationstechniken.pdf>.

\* cited by examiner

VERIFICATION AND CERTIFICATION OF AN ELECTRONIC COMPONENT

FIELD OF THE INVENTION

The invention relates to a circuit for carrying out, in particular, safety-relevant or safety-critical functions. Furthermore, the invention relates to a method for verifying the function of a configurable or programmable circuit.

BACKGROUND OF THE INVENTION

In safety-relevant or safety-critical areas stringent requirements in terms of operational safety are imposed on automation elements such as electrical or electronic units, circuits or other functional units. In this context the term "operational safety" refers, in particular, to the consideration and analysis of dangers that can arise as a result of defective functions of the automation elements during operation of such an automation element, and to minimizing these dangers, with the use of suitable measures, to an acceptable level.

In the context of this description the terms "safety-relevant areas" or "safety-critical areas" refer, in particular, to technical installations or equipment, which during their operation could pose a danger to the surroundings, i.e. to the environment and or to persons; or to technical installations whose divergent function, i.e. whose defective function, from an intended function would compromise safety. This can, for example, relate to means of transport, in particular aircraft, to industrial automation equipment or other technical installations, in particular technical installations that are operated in spatial proximity to persons.

The function of such technical installations needs to be verified, and the technical installation per se needs to be certificated for operation. In other words, it must be verified or proven that functional requirements are met by technical installations and that the latter can thus be approved for operation. In the context of verification, investigations are carried out to determine whether in the technical installation there are any divergences of the actual behavior, in other words of the actual function, from the expected or required behavior, in other words from the target function in particular predetermined scenarios, so-called test scenarios. The number and design of the test scenarios can vary from one field of application to another of the technical installation.

If no such deviation is discovered, the technical installation is certificated for operation.

This procedure can lead to considerable expenditure for verification and thus also for certification of such technical installations that can involve a host of different configurations or operating modes, in particular when these configurations can be changed during the operating time of the technical installation. For each configuration and for each operating mode respective individual test scenarios are to be drawn up and corresponding tests are to be carried out (verification).

Modifications of the technical installation or one of its components may result in the need for renewed verification and certification if the modifications influence the required behavior and/or change the range of functions of the technical installation in such a manner that the technical installation contains functions that have not yet been verified and certificated. Influencing the required behavior can come about by functional expansion, by modification or by the removal of already existing functions.

Normally, a technical installation is verified and certificated as a whole, based on the verification of its individual components and functional units.

The certification procedure inter alia involves the two steps of verifying the technical function of a component, and furnishing proof that the function or mode of operation of the remaining components remains unaffected. This certification (verification of the function of a component, and the proof that the remaining components remain unaffected) equates to release for use. Release or approval for use is usually carried out by an independent supervisory body and means that a technical installation (including the individual function of the technical installation) is certificated.

Such components and functional units can, in particular, be electrical or electronic assemblies or components of such assemblies, for example a circuit or components of a circuit, wherein such a circuit can, for example, be used as part of a control unit.

BRIEF SUMMARY OF THE INVENTION

There may be a need to simplify verification and certification of technical assemblies for use in safety-critical or safety-relevant applications, and to reduce the verification expenditure necessary for this.

According to an aspect of the present invention, a circuit is stated that is designed to be executed in a predeterminable operating mode of a plurality of operating modes. The circuit comprises a first functional unit and a second functional unit. The first functional unit is designed as a static functional unit that in each of the plurality of operating modes of the circuit carries out an invariant, unchanging or consistent function. The second functional unit is designed as an adaptable functional unit that is designed to be configured, prior to the circuit being put into service, according to a first configuration of a plurality of different configurations. Furthermore, the adaptable functional unit is designed, during the operating time of the circuit, to maintain the first configuration so that the first configuration of the adaptable functional unit defines the predeterminable operating mode of the circuit.

A circuit designed in this manner makes it possible, by reducing the complexity and the range of functions of the circuit in the form of the first functional unit and of the second functional unit, to also reduce the verification expenditure necessary for this. By limiting the configuration options or the number of operating modes, and by structuring the circuit in a static and an adaptable functional unit, a reduction in the verification expenditure is achieved, which is tantamount to a reduction in the complexity. In this design modular re-uses of functional units in the adaptable part are possible, which reduces the verification expenditure in that verification is limited to this adaptable part only. The static part was verified earlier and does not need to be verified again.

Any change to the circuit or to its functional units cannot take place during the operating time of the circuit but only prior to putting the circuit into operation.

In other words, a circuit as described above and below provides the option that its mode of operation and its range of functions are changed and thus the circuit is configured. However, such a change or configuration of the function is limited to the time prior to putting the circuit into service. Prior to the circuit being put into service it is configured to a function or to an operating mode. In this process the function or the operating mode is selected from a plurality of functions or operating modes.

During the operating time of the circuit it is not possible to change any functions of the circuit, either by adding new functions or by changing existing functions, in other words the operating mode cannot be changed during the operating time.

Any change in the operating mode of the circuit requires renewed verification and certification of the circuit. Since the circuit comprises static functional units and adaptable functional units, such a change of the operating mode is limited to the adaptation of one or several adaptable functional units, whereas the static functional units are maintained unchanged.

Verification of the mode of operation of the circuit can be limited to verification of the adaptable functional units because the static functional units have already undergone verification.

Thus the expenditure for the verification of a circuit is reduced in that the complexity of the functional units, in other words their range of functions, is reduced, and at least adaptable functional units, after the circuit has been taken out of service and prior to the circuit being put into renewed service, are adaptable in terms of their range of functions, but not, however, during the operating time of the circuit.

On the one hand a current range of functions (in other words the range of functions provided during the operating time of the circuit) of the adaptable functional unit is reduced, and thus the current complexity of this adaptable functional unit is reduced too, in favor of reduced verification expenditure. On the other hand an entire range of functions (in other words the number of different configurations of the adaptable functional unit, which configurations can optionally be taken individually in each case) of the adaptable functional unit is maintained in that the adaptable functional unit provides the option of adapting its range of functions outside the operating time of the circuit, in other words of differently configuring the adaptable functional unit.

If the extent of the entire available range of functions is expanded, in other words given new functions, then it may be sufficient in each case to individually verify and certify said new functions.

The term "operating time" refers to the time period between the beginning of the use of the circuit for a particular task and the end of the use of the circuit for this particular task. Within this time period the circuit can thus be disconnected from an energy supply and can subsequently be activated anew, wherein the circuit then operates in the same operating mode as it did before disconnection from the energy supply. However, as soon as the configuration of the circuit is changed, its operating time in this operating mode or in this configuration is terminated.

The configuration of the circuit comprises its technical or logic and structural design and the functions carried out therewith, in other words the mode of operation of the circuit. Any change of an individual aspect of the configuration of the circuit requires renewed verification, at least of the changed aspect or of the changed functional unit.

The adaptable functional unit has several possible configurations and during the concept time or configuration time has one single configuration of the plurality of possible configurations firmly assigned to it. Thus during the operating time the function of the adaptable functional unit cannot be changed; however, reconfiguration is possible after the circuit has been taken out of service, and consequently some other operating mode or some other function is assigned to the circuit. By doing away with changing the configuration during the operating time, the complexity of the adaptable functional unit is reduced, which furthermore also reduces the expenditure associated with verification of this functional unit.

According to one embodiment the circuit is designed to unchangeably maintain the first configuration of the adaptable functional unit during the operating time of the circuit.

According to a further embodiment the circuit is designed to unchangeably maintain the first configuration of the adaptable functional unit during the operating time of the circuit at least until the circuit is taken out of service.

According to a further embodiment the adaptable functional unit is designed, after the operating time and prior to the circuit being put into service anew, to be configured according to a second configuration, and after the circuit is put into service to unchangeably maintain this second configuration of the circuit at least until the circuit is taken out of service.

This makes it possible for the circuit to change its operating mode in that the adaptable functional unit is reconfigured, in particular in that only the adaptable functional unit is reconfigured. Thus, verification and certification are required only in relation to the adaptable functional unit whose range of functions has been changed, whereas there is no need to certificate anew the static functional unit, provided its mode of operation is not influenced by the reconfigured adaptable functional unit. According to a further embodiment the circuit is an electrically configurable logic circuit gate.

This can, in particular, be a so-called field programmable gate array (FPGA) to which a structure of a logic circuit can be programmed or configured. An FPGA is designed in such a manner that it can be programmed with special instructions so that an FPGA can carry out changing functions, in each case depending on the programming or on the configuration.

An FPGA comprises a plurality of so-called frames to which in each case a logic circuit structure and connections between two or more circuit structures for forwarding signals between the circuit structures can be programmed.

The first functional unit and the second functional unit can be programmed as circuit structures in a first frame or a second frame of the FPGA.

If an FPGA is reconfigured, i.e. if the contents of the frames are described anew, usually the entire configuration of the FPGA is transmitted from a configuration unit to the FPGA. In this process the frames are, for example, programmed, i.e. configured, one after the other. If in such a reconfiguration of the FPGA the content of the first frame is not changed (in other words if the static functional unit is located in the first frame), there is no need to subject the circuit structure of this first frame to verification. If the content of the second frame is changed and if this circuit structure has not yet been verified, the function of this second frame, in other words the adaptable functional unit, is subjected to verification.

The commands used for configuring the FPGA are converted to electrical signals by the configuration unit and on the FPGA are transposed to circuit structures of functional units and connections between functional units.

There is thus a direct and defined interrelation between the commands used for configuring the FPGA, the electrical signals that are transmitted to an FPGA module, the thus realized logic circuit structures on the FPGA module, and lastly the mode of operation and functioning of the FPGA and of the individual functional units on the FPGA.

However, the functional units can also be individual physical units for a circuit, wherein the circuit comprises a plurality of such functional units.

The circuit can be designed as a plug-in module or expansion module for an arithmetic-logic unit or control unit. The actual functions of the static functional unit and of the adaptable functional unit can vary, depending on the particular field of application. Thus, the functional units can comprise memory modules whose size and access option can vary. The functional units can be input/output modules or a data processing unit, wherein the data processing unit receives a set of input data, processes this data according to the configured function, and provides output data.

The circuit can be used for controlling or monitoring safety-critical processes, for example in an aircraft for navigation, for the autopilot, or for life-sustaining systems. Likewise, the circuit can be used for controlling weapon systems. The plurality of possible configurations of the adaptable functional unit can relate to functions of differing criticality, for example as a control unit for life-sustaining systems (high criticality) and as a control unit for entertainment systems (low criticality) on board aircraft.

According to a further embodiment the circuit can comprise a plurality of adaptable functional units which, taken individually, can be adaptable and replaceable.

According to a further aspect a method for verifying the function of an electrically configurable logic circuit gate is stated, wherein a function of the circuit gate is specified in that the circuit gate is configured by way of electrical signals, and wherein the electrical signals specify the functions of the circuit gate. The method comprises the following steps: in a first step detecting a signal pattern of the electrical signals by means of which the circuit gate is configured takes place; in a following step reconciling the detected signal pattern with a plurality of signal patterns of already verified functions takes place; in a following step a reduced signal pattern is determined by removing the signal patterns of already verified functions from the detected signal pattern; in a following step the function of the reduced signal pattern is verified.

This method allows simple recognition of the changed functional units of a configurable circuit gate with little expenditure because the electrical signals by means of which the circuit gate is configured are analyzed.

The electrical signals used for configuring directly determine the range of functions of the circuit gate; it is thus sufficient if for determining divergent functions of the circuit gate the divergences in the electrical signals that configure the logic circuit gate are determined.

According to one embodiment of the method, in the step of reconciling the detected signal pattern with a plurality of signal patterns of already verified functions, value-discrete signals are compared to each other.

This can simplify reconciliation of signal sequences and can reduce the error rate during reconciliation.

According to a further embodiment of the method, in the step of reconciling the detected signal pattern with a plurality of signal patterns of already verified functions, binary signals are compared to each other.

According to a further embodiment of the method, reconciling the detected signal pattern with a plurality of signal patterns of already verified functions takes place by means of a bit pattern comparison.

According to a further aspect a device for verifying the function of a configurable circuit is stated. The device is designed to read-in a signal pattern of an electrical signal for configuring the circuit, and to carry out the method as described above and below.

In this process, reading-in the electrical signal can take place by means of an acquisition unit in that electrical signals on a configuration line are acquired. The acquisition unit can, in particular, be designed to read-in voltage levels as well as any changes therein over the time on the configuration line.

To this effect the device for verifying the function of a configurable circuit can be coupled to a configuration unit or to the configurable circuit in such a manner that the device directly acquires the electrical signal used for configuring the circuit when this electrical signal is transmitted by the configuration unit by way of the configuration line to the configurable circuit.

According to one embodiment the device for verifying the function of a configurable circuit can be designed to read-in representations of the electrical signals, in other words of the configuration signals, and to process them according to the further steps of the method.

The term "representations of the electrical signals" refers, for example, to a numeric representation of a curve of an electrical configuration signal of a configurable circuit over time. These representations of electrical signals can, for example, be read from a memory unit by the device for verifying (verification device) the function of a configurable circuit, wherein the memory unit can comprise a plurality of representations of electrical signals.

In this embodiment the verification device can compare a first representation of electrical configuration signals with a second representation of electrical configuration signals. In this process the part that corresponds to the representations of the electrical configuration signals which represent the static functional unit is detected from both representations. These two parts are checked to determine whether they are identical. If they are identical, these parts are excluded from renewed verification because verification of these static functional units has already taken place. In this embodiment reconciliation can take place in such a manner that patterns relating to entire frames of the circuit are reconciled.

If individual functional units are programmed to respective individual frames of the configurable circuit, such a comparison of the representations of the signal sequences for functional units can on the whole take place more easily because the beginning of a new frame can unambiguously be recognized in a representation of the signal sequence.

In this embodiment, for example, the representation of the first signal sequence can comprise two sub-sequences that correspond to two already verified functional units. The first sub-sequence corresponds to a static functional unit, and the second sub-sequence corresponds to an adaptable functional unit. In this arrangement a sub-sequence corresponds to the content of a frame of an FPGA.

The verification unit compares the representation of each sub-sequence of the first signal sequence with the representation of each sub-sequence of the verified second signal sequence of the two configurations. If identical sub-sequences are detected, they are no longer used for the further consideration of the first signal sequence to be verified. Thus from the representations of the first signal sequence those sub-sequences remain that correspond to the adaptable functional unit. Only these sub-sequences are to be verified in terms of their own function and in terms of the interfaces to other functional units and/or already verified functional units.

BRIEF DESCRIPTION OF THE DRAWINGS

Below, exemplary embodiments of the invention are discussed in more detail with reference to the enclosed drawings. The following are shown.

DETAILED DESCRIPTION

Figure 1:
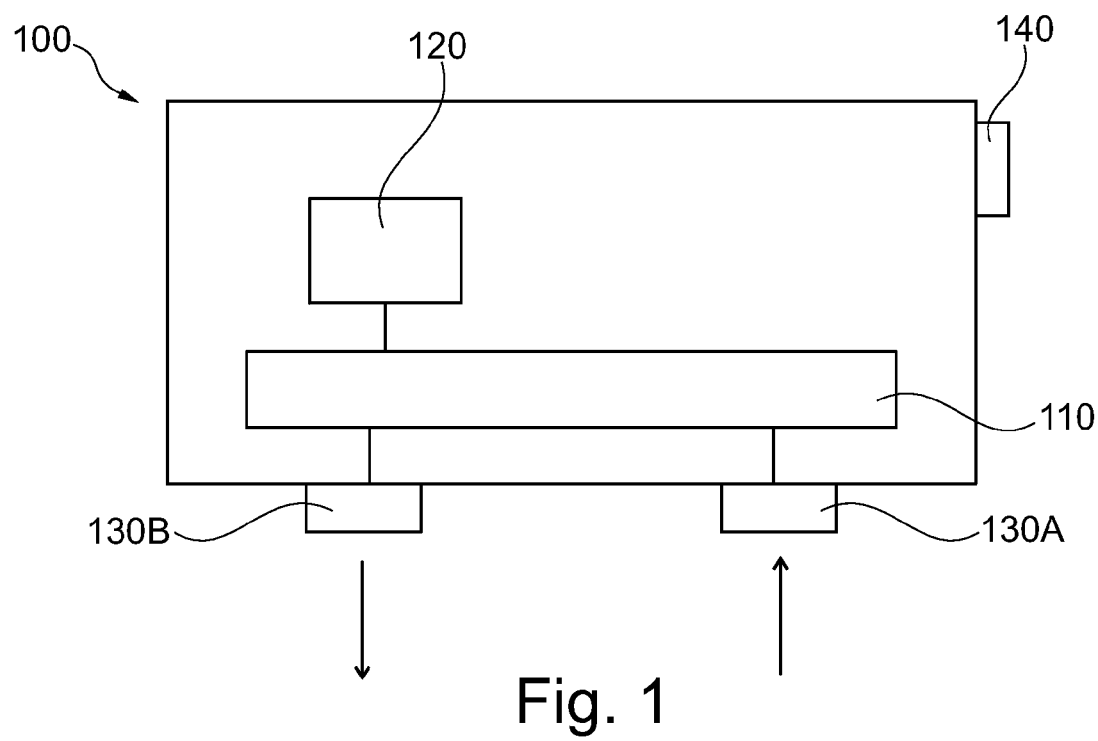
FIG. 1 a circuit according to an exemplary embodiment.

FIG. 1 shows a circuit 100 with a first functional unit 110 and a second functional unit 120. The two functional units 110, 120 are modules or functional blocks of the circuit 100.

The first functional unit 110 is designed as a static functional unit, and the second functional unit 120 is designed as an adaptable functional unit. Dividing an overall function of the circuit 100 into a static unit and an adaptable unit takes place in such a manner that in the static unit those functions are contained that do not differ for various fields of application.

The static unit can comprise different configuration sets, for example a first configuration set for a first group of fields of application and a second configuration set for a second group of fields of application, if in this manner more common features relating to the static unit can be identified.

The circuit 100 comprises an input interface 130A and an output interface 130B.

By way of the input interface 130A signals or data are transmitted to the circuit, which signals or data are processed by the functional units of the circuit. This can, for example, relate to data from sensors.

By way of the output interface 130B the circuit 100 emits signals that are, for example, used as control signals for actuators or that represent a processing result of the signals on the input interface.

The circuit 100 comprises a configuration interface 140. By way of this interface a programmable circuit is configured, i.e. the circuit receives those signals that define the function of the circuit.

Figure 2:
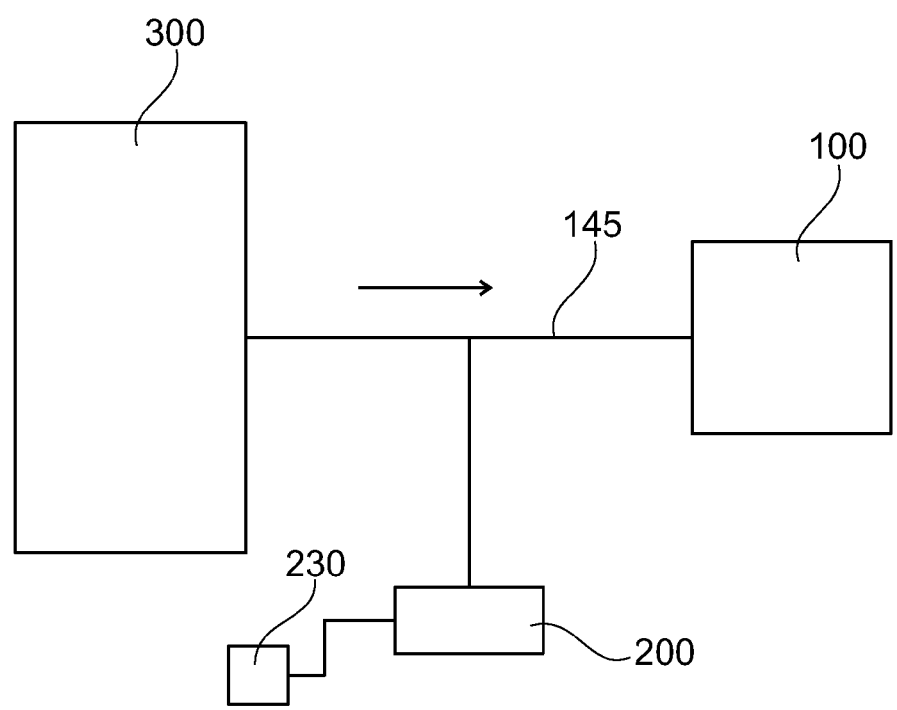
FIG. 2 a device for verifying the function of a configurable circuit according to an exemplary embodiment.

FIG. 2 shows a circuit 100 that by way of the configuration interface is coupled to a configuration unit 300. The configuration unit 300 is designed to convert commands for configuring the circuit 100 to electrical signals, and to transmit these electrical signals by way of the configuration connection 145 to the circuit 100, as indicated by the single arrow along the configuration connection 145.

A verification unit 200 (device for verifying the function of a configurable circuit) is coupled to the configuration connection 145 and is designed to detect the electrical signals transmitted by way of the configuration connection 145.

The detected signals are reconciled, by the verification unit 200, with signal patterns stored in a memory unit 230. The signal patterns stored therein can be already verified signal patterns, and thus already verified commands or electrical signals for functional units of the circuit.

If a signal pattern is detected that is stored in the memory unit 230, this means that this signal pattern or this signal sequence can be excluded from renewed verification because it is a signal sequence that has already been verified.

In order to make it possible to achieve context-dependent recognition of signal patterns, reconciliation can take place in such a manner that signal patterns for entire frames of the circuit are reconciled. In this way it is possible to avoid a situation where sub-sections of a non-verified functional unit, which are also found as sub-sections of a verified functional unit, can be recognized as having been verified.

In other words, a functional unit is reconciled as a whole with the already verified functional units, because the functional unit as a whole needs to be verified.

If individual functional units are programmed to respective individual frames of the configurable circuit, such a comparison of the signal sequences for functional units on the whole can take place more easily because the beginning of a new frame can unambiguously be recognized in a signal sequence.

Figure 3:
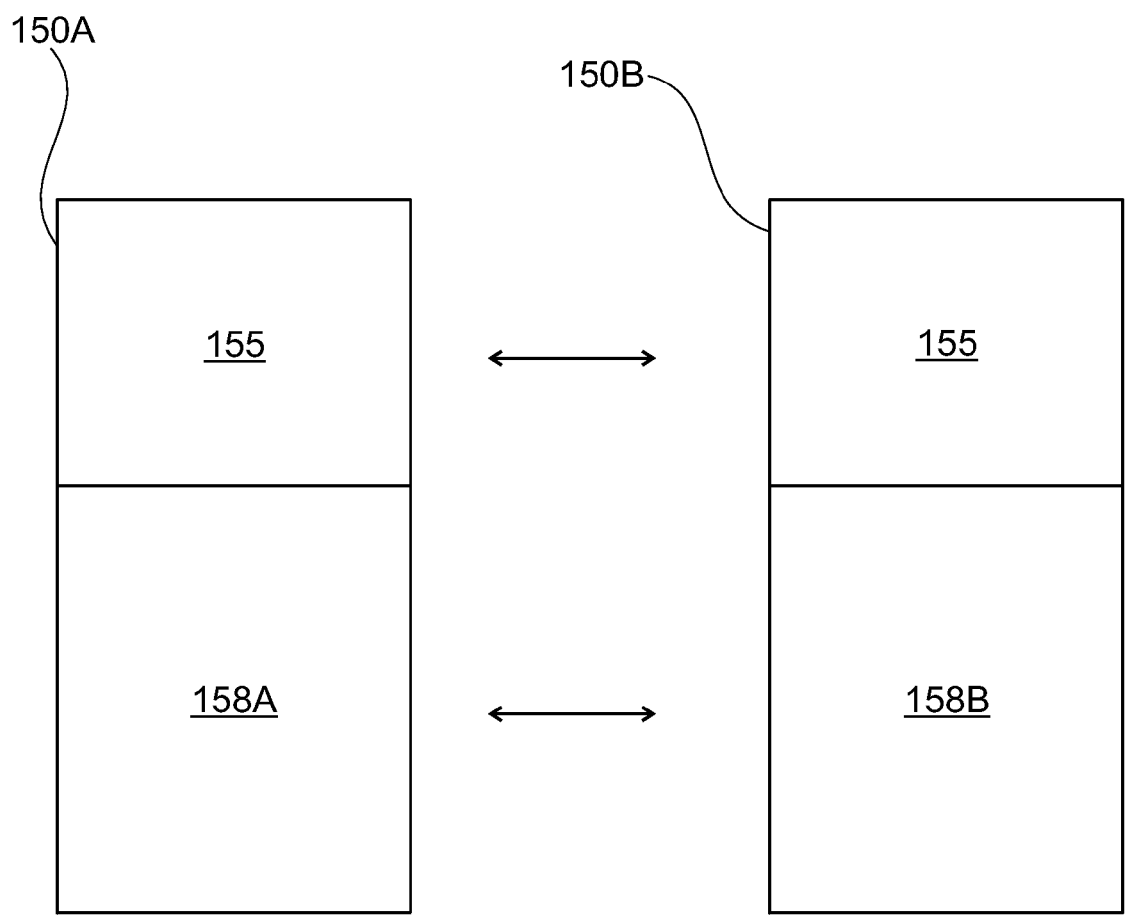
FIG. 3 steps of a method according to an exemplary embodiment.

FIG. 3 diagrammatically shows the reconciliation of two signal sequences 150A, 150B. The signal sequence 150A can, for example, comprise two sub-sequences 155, 158A that correspond to two already verified functional units. Sub-sequence 155 corresponds to a static functional unit, and sub-sequence 158A corresponds to an adaptable functional unit. A sub-sequence corresponds to the content of a frame of an FPGA.

If a circuit is then configured with new functional units according to the signal sequence 150B, the sub-sequences 155 and 158B are transmitted by the configuration unit 300 to the circuit 100, and are detected by the verification unit 200 (see FIG. 2).

Sub-sequences 155, 158A, which correspond to already verified functional units, are stored in the memory unit 230 (FIG. 2).

The verification unit 200 reconciles each sub-sequence of the signal sequence 150B with each verified signal sequence from the memory unit. If in the memory unit 230 identical sub-sequences are determined, they are no longer used for the further consideration of the detected signal sequence. From the signal sequence 150B those sub-sequences then remain that were not found in the memory unit. In the example of FIG. 3 this is the sub-sequence 158B. Only these sub-sequences are to be verified in terms of their own function and in terms of the interfaces to other functional units and/or already verified functional units.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A circuit configured to be executed in a predeterminable operating mode of a plurality of operating modes, the circuit comprising:
   a first functional unit;
   a second functional unit;
   wherein the first functional unit is configured as a static functional unit configured, in each of the plurality of operating modes of the circuit, to carry out a consistent function;
   wherein the second functional unit is configured as an adaptable functional unit configured, prior to the circuit being put into service, according to a first configuration of a plurality of different configurations;
   wherein the second functional unit is configured, during the operating time of the circuit, to maintain the first configuration so that the first configuration of the second functional unit defines the predeterminable operating mode of the circuit; and wherein the static functional unit is configured to carry out the same function in each of the plurality of operating modes of the circuit;

wherein the adaptable functional unit is configured to carry out a different function in each of the plurality of operating modes of the circuit;

wherein the circuit is configured to enable distinguishing between static functions and dynamic functions and to determine which of the dynamic functions are known and already verified and which are not known and not verified yet; and wherein the circuit enables verification of only those dynamic functions which are not known.

2. The circuit of claim 1, wherein the circuit is configured to unchangeably maintain the first configuration of the second functional unit during the operating time of the circuit.

3. The circuit of claim 2, wherein the circuit is configured to unchangeably maintain the first configuration of the second functional unit during the operating time of the circuit at least until the circuit is taken out of service.

4. The circuit of claim 1, wherein the second functional unit comprises a plurality of adaptable functional units.

5. The circuit of claim 1, wherein the second functional unit is configured, after the operating time and prior to the circuit being put into service anew, to be configured according to a second configuration, and after the circuit is put into service to unchangeably maintain this second configuration at least until the circuit is taken out of service.

6. The circuit of claim 1, wherein the circuit is an electrically configurable logic circuit gate.

7. A method for verifying the function of an electrically configurable logic circuit gate, wherein a function of the circuit gate is specified in that the circuit gate is configured by way of electrical signals, wherein the electrical signals specify the functions of the circuit gate;

the method comprising:
detecting a signal pattern of the electrical signals;
reconciling the detected signal pattern with a plurality of signal patterns of already verified functions;
determining a reduced signal pattern by removing the signal patterns of already verified functions from the detected signal pattern;
verifying only the function of the reduced signal pattern,
wherein the already verified functions are known functions, and
wherein the reduced signal pattern corresponds to those dynamic functions which are not known yet.

8. The method of claim 7, wherein in the step of reconciling the detected signal pattern with a plurality of signal patterns of already verified functions, value-discrete signals are reconciled to each other.

9. The method of claim 7, wherein in the step of reconciling the detected signal pattern with a plurality of signal patterns of already verified functions, binary signals are reconciled to each other.

10. The method of claim 9, wherein reconciling the detected signal pattern with a plurality of signal patterns of already verified functions takes place by means of a bit pattern comparison.

11. A device for verifying the function of a configurable circuit, wherein the device is configured to read-in a signal pattern of an electrical signal for configuring the circuit; and wherein the device is configured to carry out a method comprising:

detecting a signal pattern of the electrical signals;
reconciling the detected signal pattern with a plurality of signal patterns of already verified functions;
determining a reduced signal pattern by removing the signal patterns of already verified functions from the detected signal pattern;
verifying only the function of the reduced signal pattern,
wherein the already verified functions are known functions, and
wherein the reduced signal pattern corresponds to those dynamic functions which are not known yet.

* * * * *